(12) United States Patent
Honaga et al.

(10) Patent No.: US 8,564,017 B2
(45) Date of Patent: Oct. 22, 2013

(54) SILICON CARBIDE SEMICONDUCTOR DEVICE AND METHOD FOR MANUFACTURING SAME

(75) Inventors: Misako Honaga, Osaka (JP); Takeyoshi Masuda, Osaka (JP); Keiji Wada, Osaka (JP); Toru Hiyoshi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/485,423

(22) Filed: May 31, 2012

(65) Prior Publication Data
US 2012/0305943 A1 Dec. 6, 2012

Related U.S. Application Data

(60) Provisional application No. 61/492,689, filed on Jun. 2, 2011.

(30) Foreign Application Priority Data

Jun. 1, 2011 (JP) ................................. 2011-123076

(51) Int. Cl.
*H01L 29/66* (2006.01)
*H01L 21/337* (2006.01)
*H01L 29/15* (2006.01)

(52) U.S. Cl.
USPC ............. 257/134; 257/77; 257/256; 257/264; 257/269; 435/105; 435/142; 435/186; 435/931

(58) Field of Classification Search
USPC ........... 257/77, 134, 135, 136, 256, 257, 258, 257/263, 264, 268, 269; 438/105, 142, 186, 438/931
See application file for complete search history.

(56) References Cited

U.S. PATENT DOCUMENTS

2006/0057796 A1  3/2006  Harada et al.
2009/0020766 A1  1/2009  Ohtsuka et al.

FOREIGN PATENT DOCUMENTS

| JP | 2007-184434 | 7/2007 |
| JP | 2009158788 A | 7/2009 |
| JP | 2011023757 A | 2/2011 |
| WO | WO-2007/108439 A1 | 9/2007 |

*Primary Examiner* — Thanh V Pham
(74) *Attorney, Agent, or Firm* — Venable LLP; Michael A. Sartori (57) ABSTRACT

A drift layer has a thickness direction throughout which a current flows and has an impurity concentration $N_{1d}$ for a first conductivity type. A body region is provided on a portion of the drift layer, has a channel to be switched by a gate electrode, has an impurity concentration $N_{1b}$ for the first conductivity type, and has an impurity concentration $N_{2b}$ for the second conductivity type greater than the impurity concentration $N_{1b}$. A JFET region is disposed adjacent to the body region on the drift layer, has an impurity concentration $N_{1j}$ for the first conductivity type, and has an impurity concentration $N_{2j}$ for the second conductivity type smaller than the impurity concentration $N_{1j}$. $N_{1j}-N_{2j}>N_{1d}$ and $N_{2j}<N_{2b}$ are satisfied.

7 Claims, 6 Drawing Sheets

SILICON CARBIDE SEMICONDUCTOR DEVICE AND METHOD FOR MANUFACTURING SAME

BACKGROUND OF THE INVENTION

1. Field of the Invention

The present invention relates to a silicon carbide semiconductor device and a method for manufacturing the silicon carbide semiconductor device.

2. Description of the Background Art

In recent years, there has been examined a method for manufacturing a vertical type MOSFET (Metal Oxide Semiconductor Field Effect Transistor) using silicon carbide.

According to one method disclosed in Japanese Patent Laying-Open No. 2009-158788 (Patent Literature 1), a substrate made of a semiconductor having a first conductivity type is first prepared. Onto the substrate, a material gas and a dopant gas of the first conductivity type are introduced to epitaxially grow a buffer layer thereon by means of vapor phase reaction. Onto the buffer layer, a material gas and a dopant gas of the first conductivity type are introduced to epitaxially grow a drift layer thereon by means of vapor phase reaction. Into a surface of the drift layer, ions of an impurity of a second conductivity type are implanted to form a body region. Into the body region, ions of an impurity of the first conductivity type are implanted to form a source region.

Meanwhile, according to one method disclosed in Japanese Patent Laying-Open No. 2011-023757 (Patent Literature 2), a p type layer is deposited, and then the p type layer is subjected to selective ion implantation of an n type impurity using a mask, whereby the p type layer is adapted to have a portion serving as an n type region. In this way, the n type region is formed between p type well layers.

According to the method disclosed in Japanese Patent Laying-Open No. 2009-158788, a path for a current flowing in the drift layer in the MOSFET is narrowed by a depletion layer extending from the p type body region, in the same principle as that for a JFET (Junction Field Effect Transistor). This makes it difficult to sufficiently reduce the on-resistance of the MOSFET.

Meanwhile, according to the method disclosed in Japanese Patent Laying-Open No. 2011-023757, the portion having its conductivity type converted from p type to n type as a result of the ion implantation constitutes the front-side surface of the drift layer. This portion includes: an impurity (also referred to as "p type impurity") for providing the silicon carbide with p type; and an impurity (also referred to as "n type impurity") having a doping concentration higher than that of the p type impurity to provide the silicon carbide with n type. In this case, the p type impurity and n type impurity canceling each other do not contribute to providing the conductivity types, but increase a total impurity concentration in the silicon carbide. In other words, the impurity concentration in the silicon carbide becomes unnecessarily high, with the result that carriers flowing in the silicon carbide are more frequently scattered by the impurities. This makes it difficult to sufficiently reduce the on-resistance of the MOSFET.

SUMMARY OF THE INVENTION

The present invention has been made to solve such a problem and has its object to provide a silicon carbide semiconductor device allowing for reduced on-resistance, as well as a method for manufacturing such a silicon carbide semiconductor device.

A silicon carbide semiconductor device in the present invention has a gate electrode for switching a current, and includes a drift layer, a body region, and a JFET region. The drift layer has a thickness direction throughout which the current flows and has an impurity concentration $N_{1d}$ for a first conductivity type. The body region is provided on a portion of the drift layer, has a channel to be switched by the gate electrode, has an impurity concentration $N_{1b}$ for the first conductivity type, and has an impurity concentration $N_{2b}$ for a second conductivity type greater than the impurity concentration $N_{1b}$. The JFET region is disposed adjacent to the body region on the drift layer, has an impurity concentration $N_{1j}$ for the first conductivity type, and has an impurity concentration $N_{2j}$ for the second conductivity type smaller than the impurity concentration $N_{1j}$. $N_{1j}-N_{2j}>N_{1d}$ and $N_{2j}<N_{2b}$ are satisfied.

According to the silicon carbide semiconductor device of the present invention, $N_{1j}-N_{2j}>N_{1d}$ is satisfied. In other words, the substantial impurity concentration in the JFET region becomes higher than the impurity concentration in the drift layer. In this way, the depletion layer is restrained from expanding in the JFET region, thereby securing a wider path for a current in the JFET region.

Further, $N_{2j}<N_{2b}$ is satisfied. Specifically, the impurity concentration $N_{2j}$ for the second conductivity type, which does not contribute to providing the substantial conductivity type in the JFET region, is made small. In this way, carriers flowing in the JFET region are less frequently scattered by the impurities, thereby attaining a small resistivity in the JFET region.

As described above, according to the silicon carbide semiconductor device of the present invention, the current path in the JFET region is wide and the resistivity of the JFET region is small. As a result, the electric resistance of the JFET region becomes small. This leads to a small on-resistance of the silicon carbide semiconductor device.

In the silicon carbide semiconductor device, $N_{1j}-N_{2j}<N_{2b}-N_{1b}$ may be satisfied. Accordingly, the substantial impurity concentration in the body region becomes high. Accordingly, the depletion layer is restrained from expanding in the body region, thereby improving an off breakdown voltage.

In the silicon carbide semiconductor device, $N_{1j}=N_{1b}$ may be satisfied. Accordingly, the impurity concentration for the first conductivity type in the JFET region becomes equal to the impurity concentration for the first conductivity type in the body region. Hence, in manufacturing the silicon carbide semiconductor device, the JFET region is formed using the epitaxial layer's portion having the impurity concentration $N_{1j}$ for the first conductivity type. Moreover, into the other portions of this layer, ions of an impurity of the second conductivity type can be implanted to form the body region. Thus, the JFET region can be formed without using ion implantation, thereby avoiding crystal defects from being generated due to ion implantation in the JFET region. In this way, the on-resistance can be smaller.

In the silicon carbide semiconductor device, $N_{1d}=N_{1b}$ may be satisfied. In this way, the impurity concentration for the first conductivity type in the body region is adapted to be equal to the impurity concentration for the first conductivity type in the drift layer. Accordingly, the impurity concentration for the first conductivity type in the body region can be avoided from being larger than the impurity concentration for the first conductivity type in the drift layer. In other words, the impurity concentration for the first conductivity type not contributing to providing the substantial conductivity type in the body region can be avoided from being increased. Accordingly, carriers flowing in the body region are restrained from being scattered by the impurities, thereby attaining a smaller on-resistance in the silicon carbide semiconductor device.

A method for manufacturing a silicon carbide semiconductor device of the present invention is a method for manufacturing a silicon carbide semiconductor device having a gate electrode for switching a current. The method includes the following steps.

A drift layer is formed to have a thickness direction throughout which the current flows and have an impurity concentration $N_{1d}$ for a first conductivity type. A body region is formed on a portion of the drift layer. The body region has a channel to be switched by the gate electrode, has an impurity concentration $N_{1b}$ for the first conductivity type, and has an impurity concentration $N_{2b}$ for a second conductivity type greater than the impurity concentration $N_{1b}$. A JFET region is formed adjacent to the body region on the drift layer, the JFET region having an impurity concentration $N_{1j}$ for the first conductivity type and having an impurity concentration $N_{2j}$ for the second conductivity type smaller than the impurity concentration $N_{1j}$, $N_{1j}-N_{2j}>N_{1d}$ and $N_{2j}<N_{2b}$ being satisfied.

According to the method for manufacturing the silicon carbide semiconductor device in the present invention, $N_{1j}-N_{2j}>N_{1d}$ is satisfied. In other words, the substantial impurity concentration in the JFET region becomes higher than the impurity concentration in the drift layer. In this way, the depletion layer is restrained from expanding in the JFET region, thereby attaining a wide path for a current flowing in the JFET region.

Further, $N_{2j}<N_{2b}$ is satisfied. In other words, impurity concentration $N_{2j}$ for the second conductivity type, which does not contribute to providing the substantial conductivity type in the JFET region, is made small. In this way, carriers flowing in the JFET region are restrained from being scattered by the impurities, thereby attaining a small resistivity in the JFET region.

As described above, according to the method for manufacturing the silicon carbide semiconductor device in the present invention, the current path in the JFET region is wide and the resistivity of the JFET region is small, whereby the electric resistance of the JFET region becomes small. This leads to a small on-resistance of the silicon carbide semiconductor device.

In the method for manufacturing the silicon carbide semiconductor device, when forming the JFET region, an epitaxial layer of the first conductivity type may be grown on the drift layer. Thus, the JFET region can be formed without using ion implantation, thereby avoiding crystal defects from being generated due to ion implantation in the JFET region. In this way, the on-resistance can be smaller.

In the method for manufacturing the silicon carbide semiconductor device, when forming the JFET region, ions of an impurity of the first conductivity type may be implanted into the drift layer. In this way, in the drift layer, a portion provided with a high impurity concentration for the first conductivity type can be selected by locally implanting the impurity ions. Accordingly, the impurity concentration for the first conductivity type can be avoided from being increased in the location of the body region. In other words, the impurity concentration for the first conductivity type not contributing to providing the substantial conductivity type in the body region can be avoided from being increased. Accordingly, carriers flowing in the body region are restrained from being scattered by the impurities, thereby attaining a smaller on-resistance in the silicon carbide semiconductor device.

As apparent from the description above, according to the present invention, the on-resistance of the silicon carbide semiconductor device can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The following describes embodiments of the present invention with reference to figures. It should be noted that in the below-mentioned figures, the same or corresponding portions are given the same reference characters and are not described repeatedly.

(First Embodiment)

Figure 1:
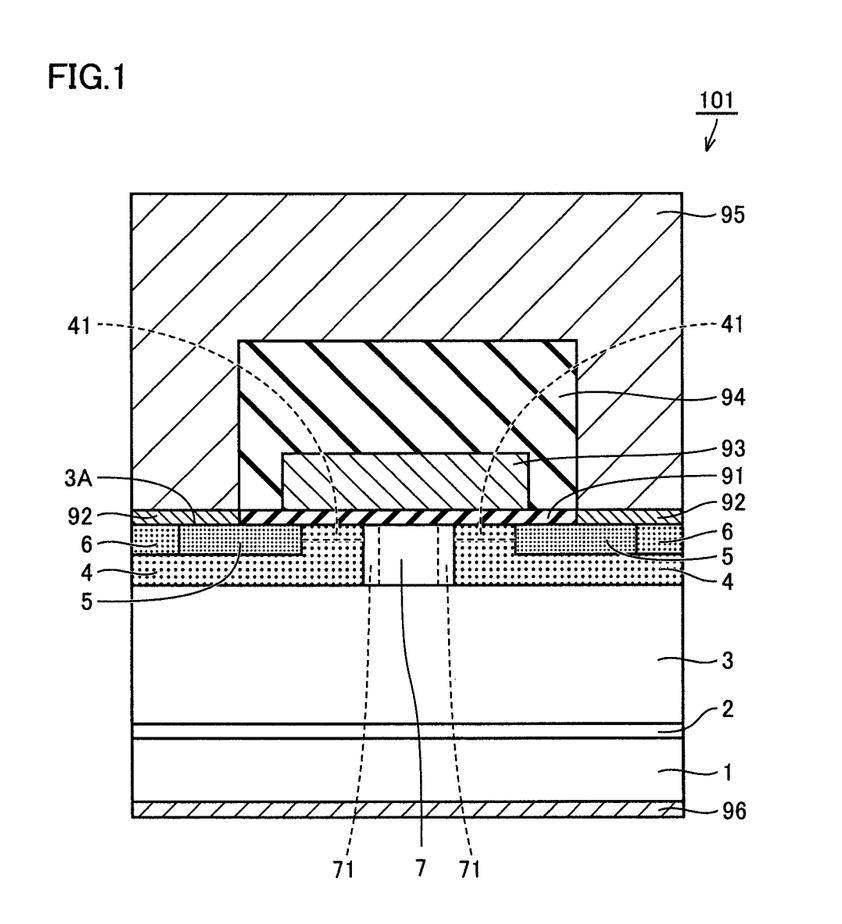
FIG. 1 is a cross sectional view schematically showing a configuration of a MOSFET serving as a silicon carbide semiconductor device in a first embodiment of the invention of the present application.

As shown in FIG. 1, a silicon carbide semiconductor device of the present embodiment is, in particular, a MOSFET 101 suitable for a power semiconductor device. More specifically, MOSFET 101 is a vertical type DiMOSFET (Double-Implanted MOSFET). MOSFET 101 includes a silicon carbide substrate 1, a buffer layer 2, a drift layer 3, a pair of body regions 4, $n^+$ regions 5, $p^+$ regions 6, a JFET region 7, a gate oxide film 91 (gate insulating film), source contact electrodes 92, a gate electrode 93, an interlayer insulating film 94, a source wire 95, and a drain electrode 96.

Drift layer 3 is provided over the upper surface of silicon carbide substrate 1 with buffer layer 2 interposed therebetween, and has a thickness direction (vertical direction in FIG. 1) throughout which a current flows. Further, drift layer 3 has an n type (first conductivity type) impurity concentration $N_{1d}$. It should be noted that drift layer 3 has a p type (second conductivity type) impurity concentration of substantially zero. Thus, the p type impurity concentration can be ignored. Hence, impurity concentration $N_{1d}$ is a substantial impurity concentration of drift layer 3. Impurity concentration $N_{1d}$ is not less than $1 \times 10^{14}$ cm$^{-3}$ and not more than $1 \times 10^{17}$ cm$^{-3}$, for example.

Buffer layer 2 has the same conductivity type as that of drift layer 3, i.e., has n type conductivity. Silicon carbide substrate 1 has the same conductivity type as that of drift layer 3, i.e., has n type conductivity. An exemplary n type impurity is N (nitrogen). Drift layer 3 has an n type impurity concentration smaller than that of buffer layer 2.

The pair of body regions 4 are provided on portions of drift layer 3 and are separated from each other. Each of body regions 4 has a channel 41 to be switched by gate electrode 93. The length of channel 41, i.e., channel length, is not less than 0.1 μm and not more than 1 μm, for example.

Each of body regions 4 has an n type impurity concentration $N_{1b}$, and has a p type impurity concentration $N_{2b}$ greater than impurity concentration $N_{1b}$. In other words, $N_{1b} < N_{2b}$ is satisfied. Accordingly, body region 4 has p type conductivity. Body region 4 has a substantial impurity concentration $N_{2b} - N_{1b}$ of, for example, not less than $5 \times 10^{16}$ cm$^{-3}$ and not more than $2 \times 10^{18}$ cm$^{-3}$ to serve as a p type semiconductor. An exemplary p type impurity is aluminum (Al) or boron (B). Body region 4 has a thickness of, for example, not less than 0.5 μm and not more than 1 μm.

Each of n$^+$ regions 5 has a conductivity type different from that of body region 4, i.e., has n type conductivity. Further, n$^+$ region 5 is disposed on and surrounded by body region 4. N$^+$ region 5 has, for example, phosphorus (P) as an n type impurity.

Each of p$^+$ regions 6 has the same conductivity type as that of body region 4, i.e., has p type conductivity. P$^+$ region 6 is disposed on and surrounded by body region 4 and is adjacent to n$^+$ region 5. P$^+$ region 6 has a p type impurity concentration greater than that of body region 4.

JFET region 7 is disposed on drift layer 3 and is adjacent to body regions 4. JFET region 7 has a width dimension (dimension in the lateral direction of FIG. 1) of, for example, not less than 1 μm and not more than 5 μm.

Further, JFET region 7 has an n type impurity concentration $N_{1j}$, and a p type impurity concentration $N_{2j}$ smaller than $N_{1j}$. In other words, $N_{1j} > N_{2j}$ is satisfied. Accordingly, JFET region 7 has an n type conductivity type. JFET region 7 has a substantial impurity concentration $N_{1j} - N_{2j}$ of, for example, not less than $1 \times 10^{14}$ cm$^{-3}$ and not more than $5 \times 10^{17}$ cm$^{-3}$ to serve as an n type semiconductor.

Further, JFET region 7 is doped to satisfy $N_{1j} - N_{2j} > N_{1d}$. Namely, substantial impurity concentration $N_{1j} - N_{2j}$ of the JFET region to serve as an n type semiconductor is greater than substantial impurity concentration $N_{1d}$ of drift layer 3 to serve as an n type semiconductor.

Further, JFET region 7 is doped to satisfy $N_{2j} < N_{2b}$. Specifically, the p type impurity concentration in JFET region 7 serving as an n type semiconductor is smaller than the p type impurity concentration in body region 4 serving as a p type semiconductor.

Further, JFET region 7 is formed of an n type epitaxial layer epitaxially grown to have n type impurity concentration $N_{1j}$ and p type impurity concentration $N_{2j}$. Into this n type epitaxial layer, ions of a p type impurity are implanted to convert the conductivity type thereof into p type, thereby forming body region 4. Thus, n type impurity concentration $N_{1b}$ of body region 4 is equal to n type impurity concentration $N_{1j}$ of the JFET region. In other words, $N_{1j} = N_{1b}$ is satisfied. It is assumed that when a change of concentration profile in the thickness direction is large, the comparison between the n type impurity concentration of JFET region 7 and the n type impurity concentration of body region 4 is performed at the same depth. Further, in determining whether or not $N_{1j} = N_{1b}$ is satisfied, it is assumed that $N_{1j}$ and $N_{1b}$ are equal to each other when a difference therebetween is 5% or smaller, in view of manufacturing variation and measurement error.

Further, preferably, JFET region 7 has p type impurity concentration $N_{2j}$ of substantially zero. In this case, the above-described relational expression $N_{1j} - N_{2j} > N_{1d}$ is simplified to $N_{1j} > N_{1d}$. Namely, each of drift layer 3 and JFET region 7 has substantially only the n type impurity, and the n type impurity concentration of JFET region 7 is greater than the n type impurity concentration of drift layer 3. Further, $N_{1j} - N_{2j} < N_{2b} - N_{1b}$ is preferably satisfied. In other words, the substantial impurity concentration of body region 4 to serve as a p type semiconductor is greater than the substantial impurity concentration of the JFET region to serve as an n type semiconductor.

Gate oxide film 91 is formed to extend from a portion above the upper surface of one n$^+$ region 5 to a portion above the upper surface of the other n$^+$ region 5. The gate oxide film is formed of, for example, silicon dioxide (SiO$_2$).

Gate electrode 93 is configured to switch a current, and is disposed on gate oxide film 91. Gate electrode 93 is made of a conductor. For example, gate electrode 93 is made of polysilicon having an impurity added thereto, a metal such as Al, or an alloy.

Each of source contact electrodes 92 extends from a portion above each of the pair of n$^+$ regions 5 in a direction away from gate oxide film 91 to reach a portion above p$^+$ region 6. Source contact electrode 92 is made of a material capable of ohmic contact with n$^+$ region 5. Preferably, source contact electrode 92 is made of a silicide, such as nickel silicide (Ni$_x$Si$_y$).

Interlayer insulating film 94 covers gate electrode 93. Interlayer insulating film 94 is made of, for example, silicon dioxide (SiO$_2$).

Source wire 95 has a portion disposed on interlayer insulating film 94 and a portion disposed on source contact electrode 92. Source wire 95 is preferably made of a metal or an alloy.

Drain electrode 96 is disposed on the backside surface of silicon carbide substrate 1. Drain electrode 96 is made of a material capable of ohmic contact with silicon carbide substrate 1. Preferably, drain electrode 96 is made of a silicide, such as nickel silicide (Ni$_x$Si$_y$).

The following describes a method for manufacturing MOSFET 101.

Figure 2:
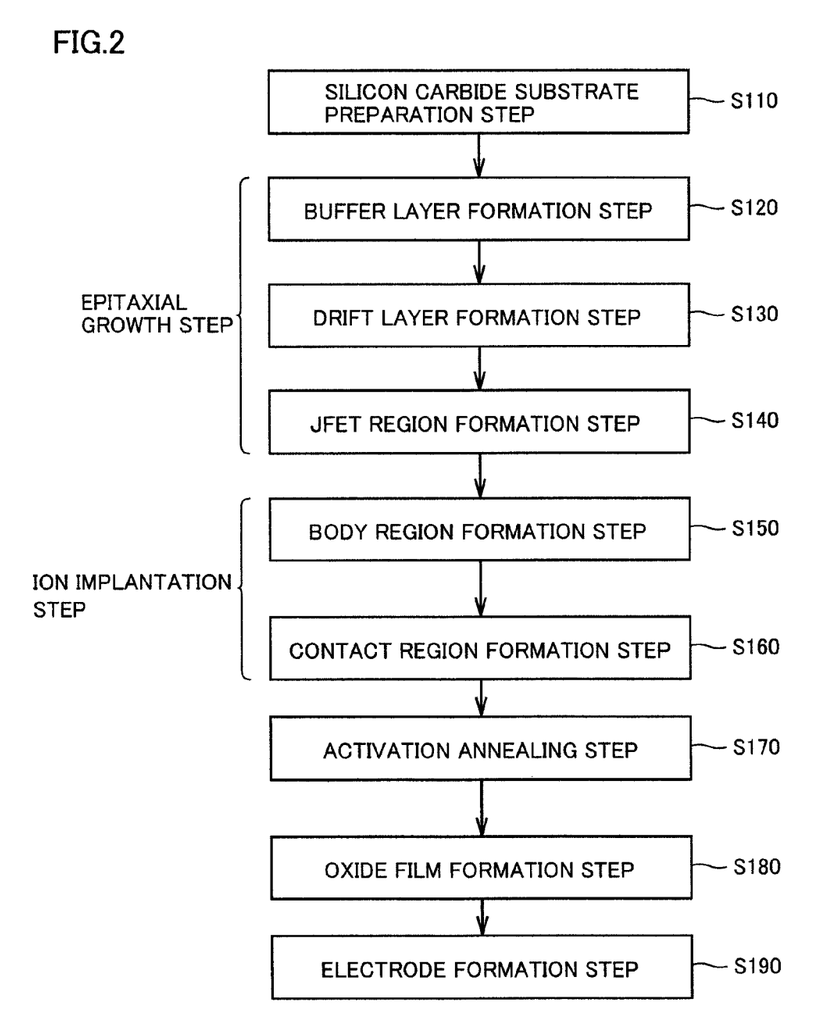
FIG. 2 is a flowchart schematically showing a method for manufacturing the MOSFET of FIG. 1.
Figure 3:
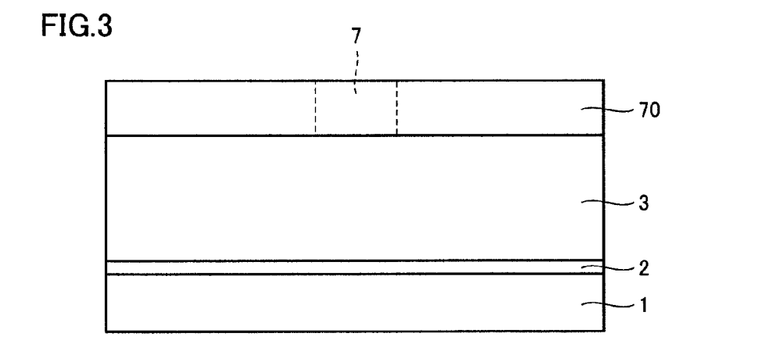
FIG. 3 is a cross sectional view schematically showing a first step in the method for manufacturing the MOSFET of FIG. 1.

As shown in FIG. 3, silicon carbide substrate 1 is first prepared (FIG. 2: step S110). Silicon carbide substrate 1 preferably has a single-crystal structure.

Next, epitaxial growth is performed on the upper surface of silicon carbide substrate 1 (FIG. 2: steps S120-S140).

Specifically, buffer layer 2 is first epitaxially formed on the upper surface of silicon carbide substrate 1 (step S120). Next, drift layer 3 is epitaxially formed on buffer layer 2 (step S130).

Next, epitaxial layer 70 of n type is grown on drift layer 3 (step S140). Epitaxial layer 70 is formed to have n type and p type impurity concentrations respectively the same as n type impurity concentration $N_{1j}$ and p type impurity concentration $N_{2j}$ of JFET region 7. It should be noted that as described above, $N_{2j}$ is preferably substantially zero.

Epitaxial layer 70 includes a portion used as JFET region 7. In other words, by forming epitaxial layer 70, JFET region 7 is formed.

Figure 4:
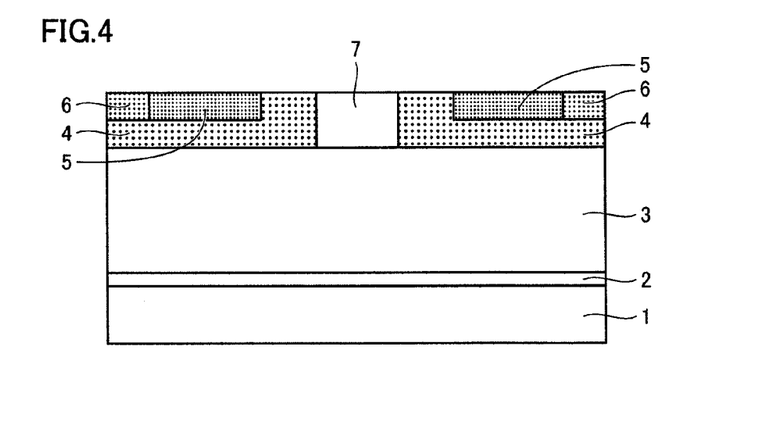
FIG. 4 is a cross sectional view schematically showing a second step in the method for manufacturing the MOSFET of FIG. 1.

Next, as shown in FIG. 4, ion implantation is performed into epitaxial layer 70 (FIG. 2: steps S150 and 160). Specifically, each of body regions 4 is formed (step S150). Further, n+ region 5 and p+ region 6, i.e., contact regions are formed (step S160).

Body region 4 is formed by implanting ions of a p type impurity into epitaxial layer 70 of n type, at an impurity concentration greater than the n type impurity concentration of epitaxial layer 70. As a result, body region 4 has n type impurity concentration $N_{1b}$ substantially the same as the n type impurity concentration of epitaxial layer 70, and p type impurity concentration $N_{2b}$ greater than $N_{1b}$.

P+ region 6 is formed by further implanting ions of a p type impurity into body region 4. N+ region 5 is formed by implanting ions of an n type impurity into body region 4.

Each of the above-described ion implantations may be performed using, for example, a mask made of silicon dioxide (SiO$_2$). It should be noted that steps S150 and S160 may be performed in either order.

Next, activation annealing (FIG. 2: step S170) is performed to activate the implanted impurities. For example, the activation annealing is performed under an argon (Ar) atmosphere at an annealing temperature of 1700° C. for an annealing time of 30 minutes.

Figure 5:
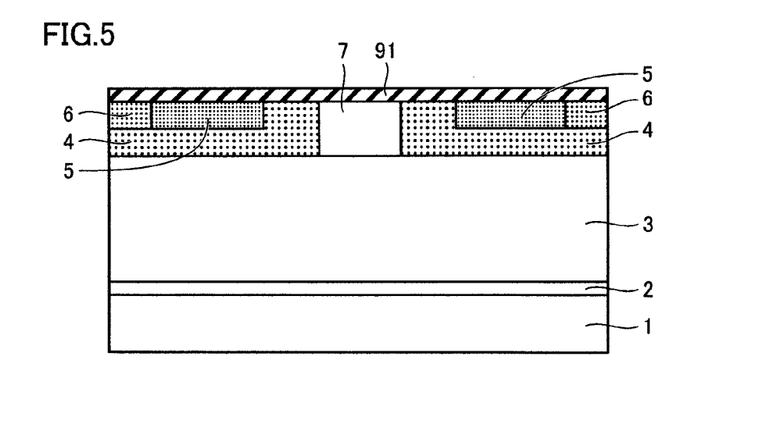
FIG. 5 is a cross sectional view schematically showing a third step in the method for manufacturing the MOSFET of FIG. 1.

Next, as shown in FIG. 5, gate oxide film 91 is formed (FIG. 2: step S180). Gate oxide film 91 can be formed through, for example, thermal oxidation of silicon carbide in an oxygen atmosphere. For example, it is performed at an annealing temperature of 1300° C. for an annealing time of 60 minutes.

Next, as shown in FIG. 1, gate electrode 93, source contact electrodes 92, and drain electrode 96 are formed (FIG. 2: step S190). Specifically, the following step is performed.

First, gate electrode 93 is formed by means of film formation and patterning. An exemplary, usable method for the film formation is a CVD (Chemical Vapor Deposition) method. Next, for example, using the CVD method, interlayer insulating film 94 is deposited to cover gate electrode 93. Next, in order to secure regions in which source contact electrodes 92 are to be formed, portions of interlayer insulating film 94 and gate oxide film 91 are removed. Next, source contact electrodes 92 and drain electrode 96 are formed. For the formation thereof, for example, nickel (Ni) films are formed using a deposition method and are then silicided. Next, source wire 95 is formed using, for example, the deposition method.

With the above procedure, MOSFET 101 is completed. According to the present embodiment, $N_{1j}-N_{2j}>N_{1d}$ is satisfied. Specifically, which is the substantial impurity concentration of JFET region 7, is greater than $N_{1d}$, which is the substantial impurity concentration of drift layer 3. In other words, the substantial impurity concentration of JFET region 7 is increased. In this way, depletion layer 71 (FIG. 1) is restrained from expanding in JFET region 7, thereby securing a wider path for a current flowing in JFET region 7 in the thickness direction. Specifically, the expansion of depletion layer 71 can be restrained to 50% or smaller in the width direction of JFET region 7 (lateral direction in FIG. 1).

Further, $N_{2j}<N_{2b}$ is satisfied. Specifically, p type impurity concentration $N_{2j}$ which does not substantially contribute to providing the conductivity type in JFET region 7, is smaller than p type impurity concentration $N_{2b}$ of body region 4. In this way, as compared with a case where the relational expression between the p type impurity concentrations, i.e., $N_{2j}=N_{2b}$ is satisfied, the impurity concentration of JFET region 7 can be avoided from being large due to the impurity not substantially contributing to providing the conductivity type. Thus, by restraining total impurity concentration $N_{1j}$+ $N_{2j}$ of JFET region 7, carriers can be restrained from being scattered by the impurities, thereby attaining a small resistivity of JFET region 7.

As described above, the path for a current flowing in JFET region 7 becomes wide and the resistivity of JFET region 7 becomes small, thereby attaining a small electric resistance of JFET region 7. In this way, the on-resistance of MOSFET 101 can be made small.

Further, $N_{1j}-N_{2j}<N_{2b}-N_{1b}$ is satisfied. In this way, the substantial impurity concentration of body region 4 becomes higher than the substantial impurity concentration of JFET region 7. Accordingly, depletion layer 71 is restrained from extending from a pn junction between JFET region 7 and body region 4 toward each of n+ regions 5. Accordingly, depletion layer 71 is less likely to reach n+ region 5, thereby improving an off breakdown voltage of MOSFET 101.

Further, $N_{1j}=N_{1b}$ is satisfied. Namely, the n type impurity concentration of JFET region 7 is substantially equal to the n type impurity concentration of body region 4. Hence, in manufacturing MOSFET 101, JFET region 7 is formed using the epitaxial layer's portion having n type impurity concentration $N_{1j}$ (=$N_{1b}$). Moreover, into the other portions of this layer, the ions of the p type impurity can be implanted to form body region 4. Thus, JFET region 7 can be formed without using ion implantation, thereby avoiding crystal defects from being generated due to ion implantation in JFET region 7. Accordingly, the resistivity of JFET region 7 becomes small, thereby attaining a smaller on-resistance of MOSFET 101.

(Second Embodiment)

Figure 6:
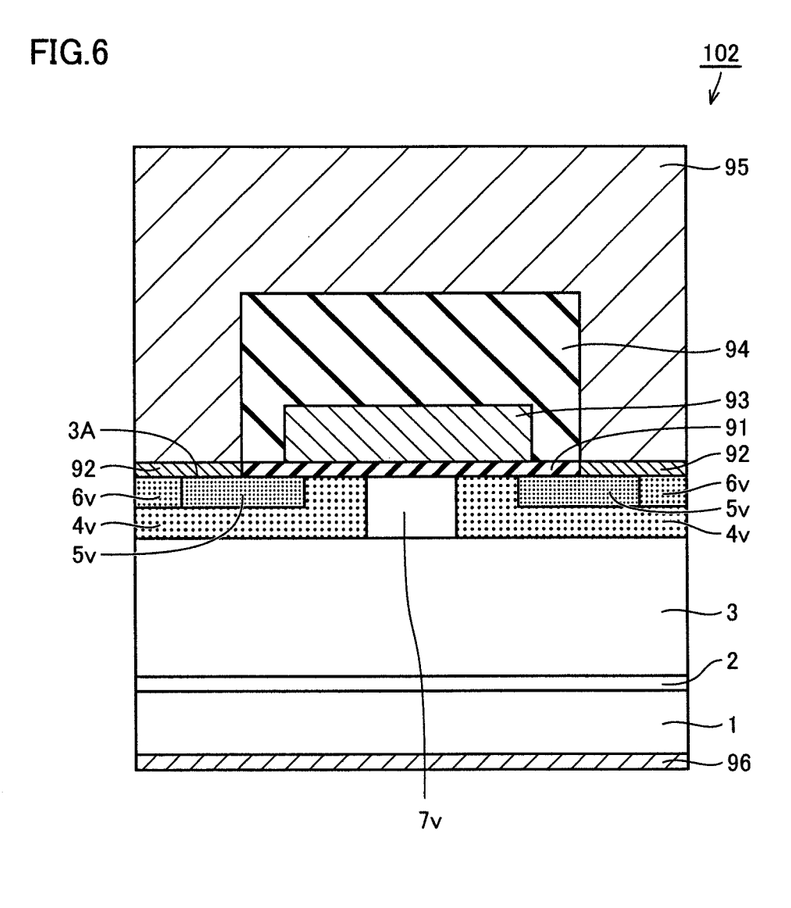
FIG. 6 is a cross sectional view schematically showing a configuration of a MOSFET serving as a silicon carbide semiconductor device in a second embodiment of the invention of the present application.

As shown in FIG. 6, instead of body regions 4, n+ regions 5, and p+ regions 6 of MOSFET 101 (FIG. 1), a MOSFET 102 of the present embodiment includes body regions 4v, n+ regions 5v, and p+ regions 6v. Further, each of body regions 4v has an n type impurity concentration $N_{1b}$, which is different from that in the first embodiment in that $N_{1b}=N_{1j}$ is not satisfied and $N_{1b}=N_{1d}$ is satisfied instead. Specifically, the n type impurity concentration of body region 4v is substantially equal to the n type impurity concentration of drift layer 3. It should be noted that when a change of concentration profile in drift layer 3 is large, the concentration of a portion of drift layer 3 which faces body region 4v is regarded as a reference concentration.

Apart from the configuration described above, the configuration of the present embodiment is substantially the same as the configuration of the first embodiment. Hence, the same or corresponding elements are given the same reference characters and are not described repeatedly.

The following describes a method for manufacturing MOSFET 102.

First, steps S110 and S120 (FIG. 7) are performed. These steps are the same as those in the first embodiment (FIG. 2).

Figure 7:
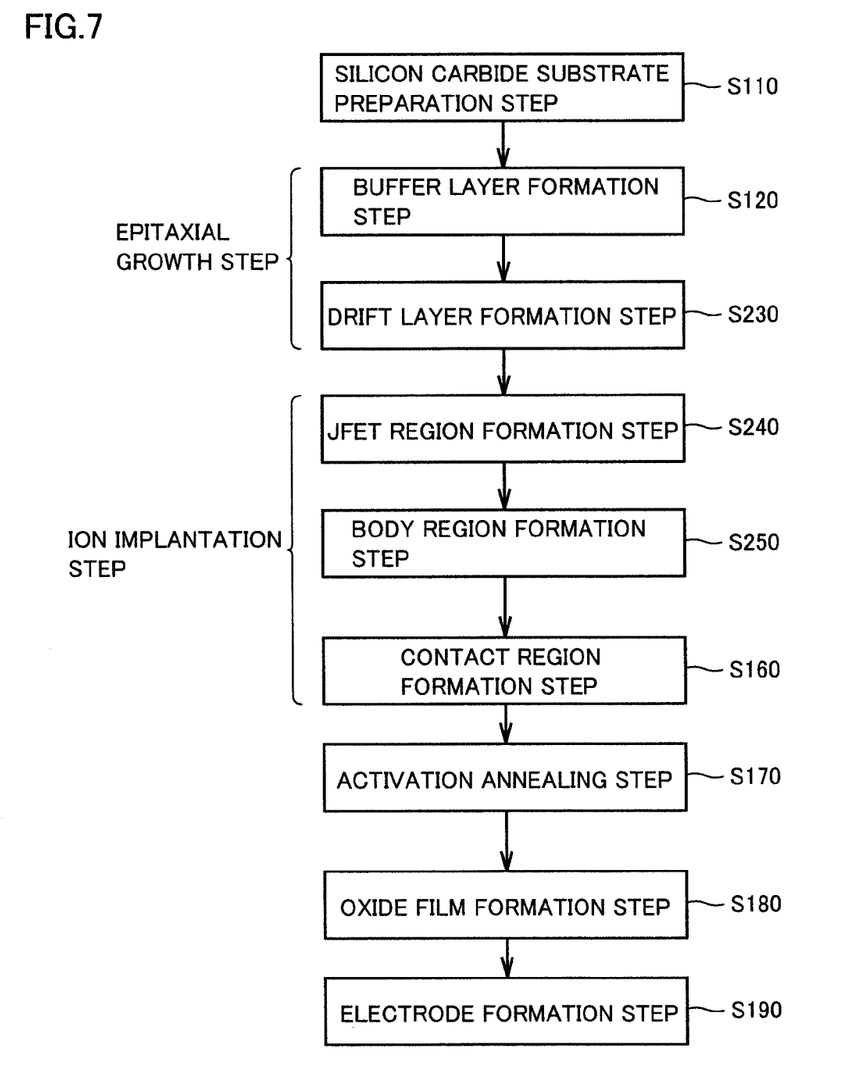
FIG. 7 is a flowchart schematically showing a method for manufacturing the MOSFET of FIG. 6.
Figure 8:
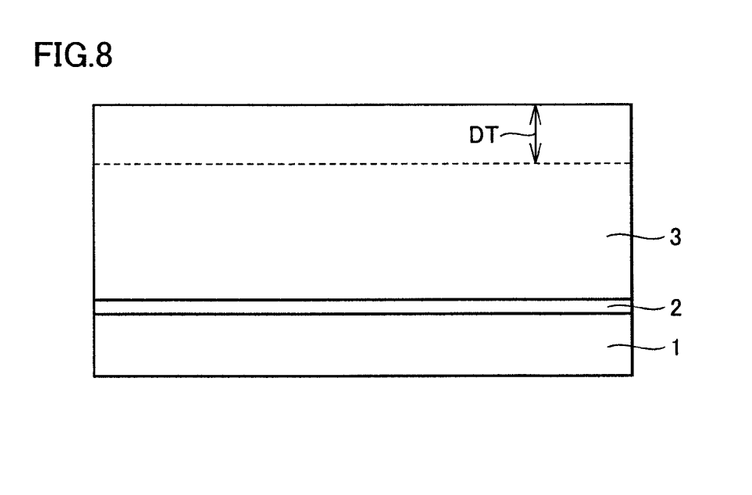
FIG. 8 is a cross sectional view schematically showing a first step in the method for manufacturing the MOSFET of FIG. 6.

Next, as shown in FIG. 8, drift layer 3 is formed (FIG. 7: step S230). In step S230, unlike step S130 (FIG. 2: the first embodiment), drift layer 3 is formed to have a thickness greater by a thickness DT than the thickness of drift layer 3 of final MOSFET 102 (FIG. 6). Thickness DT corresponds to the thickness of body region 4v (FIG. 6).

Figure 9:
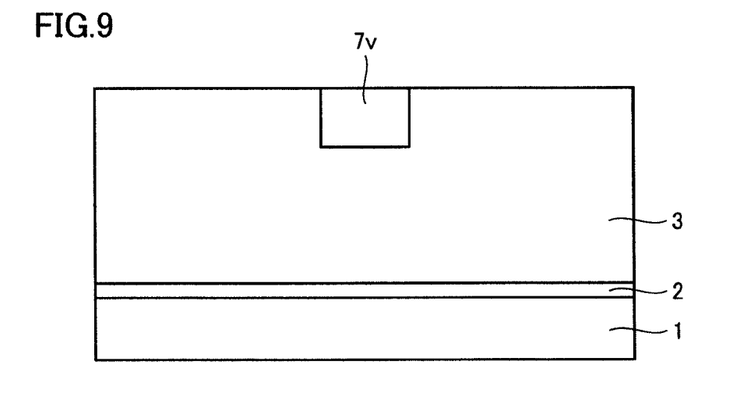
FIG. 9 is a cross sectional view schematically showing a second step in the method for manufacturing the MOSFET of FIG. 6.

Next, as shown in FIG. 9, by means of ion implantation, an n type impurity is added to drift layer 3, thereby forming JEFT region 7v (FIG. 7: step S240).

Figure 10:
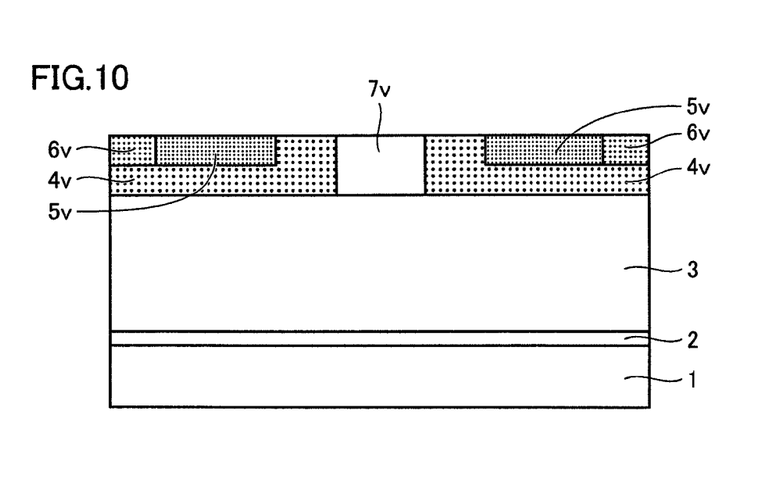
FIG. 10 is a cross sectional view schematically showing a third step in the method for manufacturing the MOSFET of FIG. 6.

Further, as shown in FIG. 10, by means of ion implantation, a p type impurity is added to drift layer 3, thereby forming body regions 4v (FIG. 7: step S250). In step S250, an amount of implanted ions may be smaller than that in step S150 (FIG. 2: the first embodiment). A difference between the amounts of implanted ions almost corresponds to $N_{1j}-N_{1d}$.

Thereafter, steps S160-S190 (FIG. 7) are performed in the same manner as in the first embodiment (FIG. 2), thereby completing MOSFET 102 (FIG. 6).

According to the present embodiment, each of body regions 4v is formed by adding the p type impurity to drift layer 3, whereby n type impurity concentration $N_{1b}$ of body region 4v and n type impurity concentration $N_{1d}$ of drift layer 3 are substantially equal to each other. In other words, $N_{1b}=N_{1d}$ is satisfied. Thus, the n type impurity concentration of body region 4v can be avoided from being larger than the n type impurity concentration of drift layer 3. In other words, concentration of an n type impurity not contributing to providing the substantial conductivity type thereto can be avoided from being increased in body region 4v of p type. In this way, carriers flowing in body region 4v are restrained from being scattered by the impurities, thereby attaining a smaller on-resistance of MOSFET 102.

In the first and second embodiments, it has been illustrated that the first conductivity type corresponds to n type and the second conductivity type corresponds to p type. However, because the first and second conductivity types may be conductivity types different from each other, the first conductivity type may correspond to p type and the second conductivity type may correspond to n type. However, in the case where the first conductivity type corresponds to n type and the second conductivity type corresponds to p type, channel resistance can be smaller than that in the case where the first conductivity type corresponds to p type and the second conductivity type corresponds to n type.

Further, the gate insulating film is not limited to the oxide film. Hence, the semiconductor device may be a MISFET (Metal Insulator Semiconductor Field Effect Transistor) other than the MOSFET. Further, the semiconductor device is not limited to the MISFET, and may be, for example, an IGBT (Insulated Gate Bipolar Transistor).

Further, in the case where a plurality of ion implantation steps are performed in the method for manufacturing the silicon carbide semiconductor device, the plurality of steps may be performed in any order.

Further, each impurity concentration can be measured using, for example, SIMS (Secondary Ion Mass Spectroscopy).

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide semiconductor device having a gate electrode for switching a current, comprising:
    a drift layer having a thickness direction throughout which said current flows and having an impurity concentration $N_{1d}$ for a first conductivity type;
    a body region provided on a portion of said drift layer, having a channel to be switched by said gate electrode, having an impurity concentration $N_{1b}$ for said first conductivity type, and having an impurity concentration $N_{2b}$ for a second conductivity type greater than said impurity concentration $N_{1b}$; and
    a JFET region disposed adjacent to said body region on said drift layer, having an impurity concentration $N_{1j}$ for said first conductivity type, and having an impurity concentration $N_{2j}$ for said second conductivity type smaller than said impurity concentration $N_{1j}$, $N_{1j}-N_{2j}>N_{1d}$ and $N_{2j}<N_{2b}$ being satisfied.

2. The silicon carbide semiconductor device according to claim 1, wherein $N_{1j}-N_{2j}<N_{2b}-N_{1b}$ is satisfied.

3. The silicon carbide semiconductor device according to claim 1, wherein $N_{1j}=N_{1b}$ is satisfied.

4. The silicon carbide semiconductor device according to claim 1, wherein $N_{1d}=N_{1b}$ is satisfied.

5. A method for manufacturing a silicon carbide semiconductor device having a gate electrode for switching a current, comprising the steps of:
    forming a drift layer having a thickness direction throughout which said current flows and having an impurity concentration $N_{1d}$ for a first conductivity type;
    forming a body region on a portion of said drift layer, said body region having a channel to be switched by said gate electrode, having an impurity concentration $N_{1b}$ for said first conductivity type, and having an impurity concentration $N_{2b}$ for a second conductivity type greater than said impurity concentration $N_{1b}$; and
    forming a JFET region adjacent to said body region on said drift layer, said JFET region having an impurity concentration $N_{1j}$ for said first conductivity type and having an impurity concentration $N_{2j}$ for said second conductivity type smaller than said impurity concentration $N_{1j}$, $N_{1j}-N_{2j}>N_{1d}$ and $N_{2j}<N_{2b}$ being satisfied.

6. The method for manufacturing the silicon carbide semiconductor device according to claim 5, wherein the step of forming said JFET region includes the step of growing an epitaxial layer of said first conductivity type on said drift layer.

7. The method for manufacturing the silicon carbide semiconductor device according to claim 5, wherein the step of forming said JFET region includes the step of implanting ions of an impurity of said first conductivity type into said drift layer.

* * * * *